(12) United States Patent
Eiji et al.

(10) Patent No.: US 8,199,389 B2
(45) Date of Patent: Jun. 12, 2012

(54) VIBRATION ELEMENTS

(75) Inventors: Mochizuki Eiji, Sendai (JP); Tetsurou Saitoh, Sendai (JP); Yukito Sato, Sendai (JP)

(73) Assignee: Ricoh Company, Ltd., Yokohama-shi (JP)

( * ) Notice: Subject to any disclaimer, the term of this patent is extended or adjusted under 35 U.S.C. 154(b) by 472 days.

(21) Appl. No.: 12/400,911

(22) Filed: Mar. 10, 2009

(65) Prior Publication Data
US 2009/0225384 A1 Sep. 10, 2009

(30) Foreign Application Priority Data

Mar. 10, 2008 (JP) ................................. 2008-060288
Mar. 14, 2008 (JP) ................................. 2008-066217

(51) Int. Cl.
*G02B 26/08* (2006.01)
(52) U.S. Cl. ................................. 359/213.1; 359/224.1
(58) Field of Classification Search .... 359/196.1–199.1, 359/201.1, 201.2, 212.1, 213.1, 221.2, 223.1, 359/224.1
See application file for complete search history.

(56) References Cited

U.S. PATENT DOCUMENTS

| 5,959,760 | A | 9/1999 | Yamada et al. | 359/224.1 |
| 7,031,041 | B2* | 4/2006 | Mi et al. | 359/224.1 |
| 7,423,787 | B2 | 9/2008 | Nakajima | 358/483 |
| 7,793,404 | B2* | 9/2010 | Murakami et al. | 29/594 |
| 7,864,392 | B2* | 1/2011 | Ueyama | 359/224.1 |
| 2002/0114053 | A1 | 8/2002 | Yasuda et al. | 359/224.1 |
| 2005/0134951 | A1* | 6/2005 | Mi et al. | 359/198 |
| 2007/0053044 | A1* | 3/2007 | Kawakami et al. | 359/223 |
| 2007/0146857 | A1* | 6/2007 | Orcutt et al. | 359/224 |
| 2008/0198433 | A1* | 8/2008 | Ueyama | 359/198 |
| 2009/0050990 | A1* | 2/2009 | Aono et al. | 257/415 |
| 2009/0290205 | A1* | 11/2009 | Satoh et al. | 359/199.2 |

FOREIGN PATENT DOCUMENTS

| JP | 4-211218 | 8/1992 |
| JP | 2002-267966 | 9/2002 |

* cited by examiner

*Primary Examiner* — Frank Font
(74) *Attorney, Agent, or Firm* — Oblon, Spivak, McClelland, Maier & Neustadt, L.L.P.

(57) ABSTRACT

A vibration unit including a frame, a vibration element including a substrate configured to vibrate, and a beam configured to connect the vibration element to the frame. The vibration unit is produced by applying an etching process to at least two surfaces of a substrate. A meeting position of the two surfaces of the substrate is located where a first etching process, which takes place on a first surface of the substrate and a second etching process, which takes place on a second surface of the substrate meet, and is located at a position other than a center position in a width direction of the beam.

13 Claims, 16 Drawing Sheets

FIG. 6
(A) IDEAL CONDITION
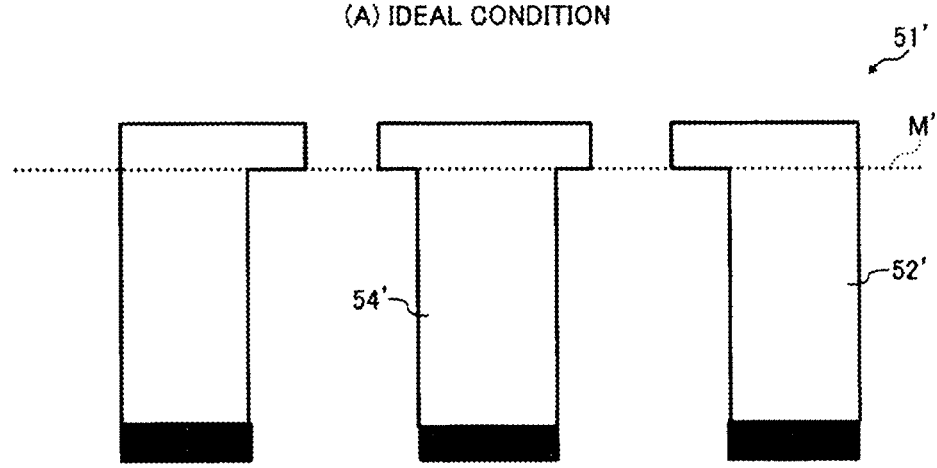
(B) ACTUAL CONDITION
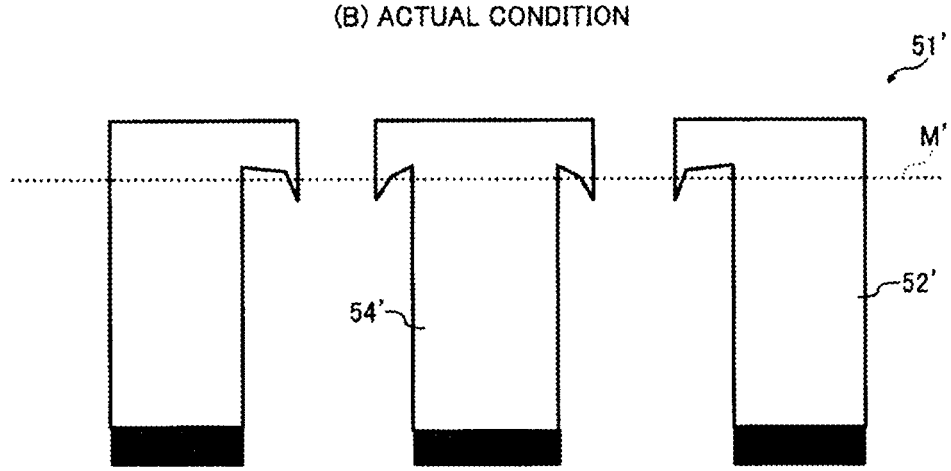

METHOD FOR MANUFACTURING A MICRO SCANNER (PZT PROCESS)

FIG. 11 METHOD FOR MANUFACTURING A MICRO SCANNER (Si PROCESS OF SECOND EMBODIMENT)

FIG. 13
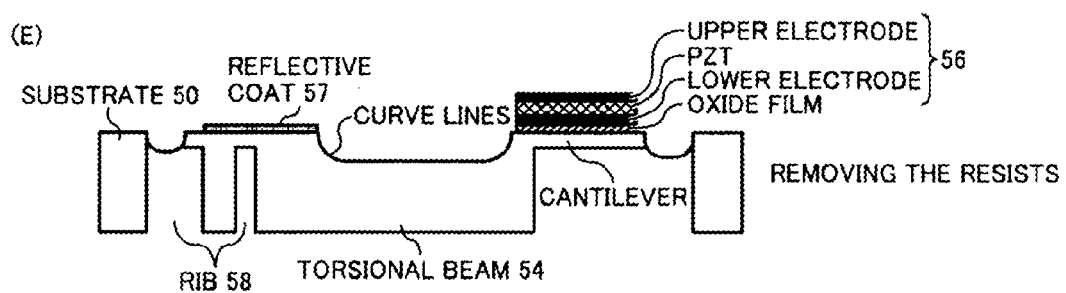
IN A CASE OF ISOTROPICALLY-ETCHED
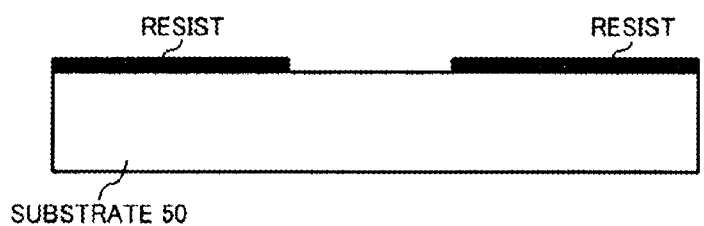
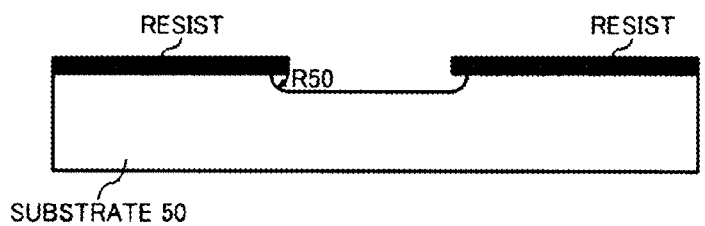

VIBRATION ELEMENTS

CROSS-REFERENCE TO RELATED APPLICATIONS

This application is based upon and claims priority under 35 U.S.C. §119 to Japanese Patent Application No. 2008-060288, filed Mar. 10, 2008 and Japanese Application No. 2008-066217, filed, Mar. 14, 2008. The entire contents of each of the above-identified applications are incorporated herein by reference.

BACKGROUND OF THE INVENTION

1. Field of the Invention

The present invention generally relates to vibration elements, a process for manufacturing a vibration element, optical scanners including the vibration element, and an image forming apparatus including the vibration element.

2. Description of the Related Art

A vibration element including a vibration part vibrates to the vibration element and a beam supporting the vibration part in order to make the vibration part available to vibrate has been known as disclosed in laid-open Japanese Patent Applications JP2002-321196, JP2002-321197, JP2002-321198, JP2002-267966, JP2002-341285, JP1999-52278, and JP1992-211218. The vibration element including a reflection part that reflects light is used as an optical element.

These optical elements have developed through research for optical deflectors using silicon micro-machining, and have advantages such as reducing electric power consumption and its size as compared to the optical elements using a polygon mirror.

It is required for the vibration elements, in case it is used as optical elements, to have a rapid vibration and a large deflection angle for obtaining higher resolution with accuracy and speeding up. These requirements are required to the vibration elements not only in case it is used for optical elements but also if it is used for other elements.

Complying with these requirements, the vibration element may cause a problem in that a beam of the vibration element will be easily damaged when the deflection angle gets larger in a vibration process of the vibration elements.

However, a structure which would be considered that a beam has greater strength in laid-open Japanese patent applications JP2002-321196, JP2002-321197, and JP2002-321198, the shown structure is relatively complex. So it is desired to strengthen the beam in a simple way.

SUMMARY OF THE INVENTION

One of the objects of the present invention is to provide a vibration unit which includes a frame; a vibration element; and a beam configured to connect the vibration element and the frame; wherein the vibration unit is produced by applying an etching process to at least two surfaces of a substrate, and a meeting position at where a first etching process which takes place onto a first surface of the substrate and second etching process takes place onto a second surface where the surfaces meet, is located at a position different from the center position of the beam in the width direction of the beam.

BRIEF DESCRIPTION OF THE DRAWINGS

Other objects, features and advantages of the present invention will become more apparent from the following detailed description when read in conjunction with the accompanying drawings, in which:

FIG. 6 is a diagram showing shapes of the meeting point M' where FIG. 6(A) is a diagram showing an ideal shape at the meeting point M' and FIG. 6(B) is a diagram showing the actual shape at the meeting point M';

DETAILED DESCRIPTION OF THE PREFERRED EMBODIMENTS

Figure 1:
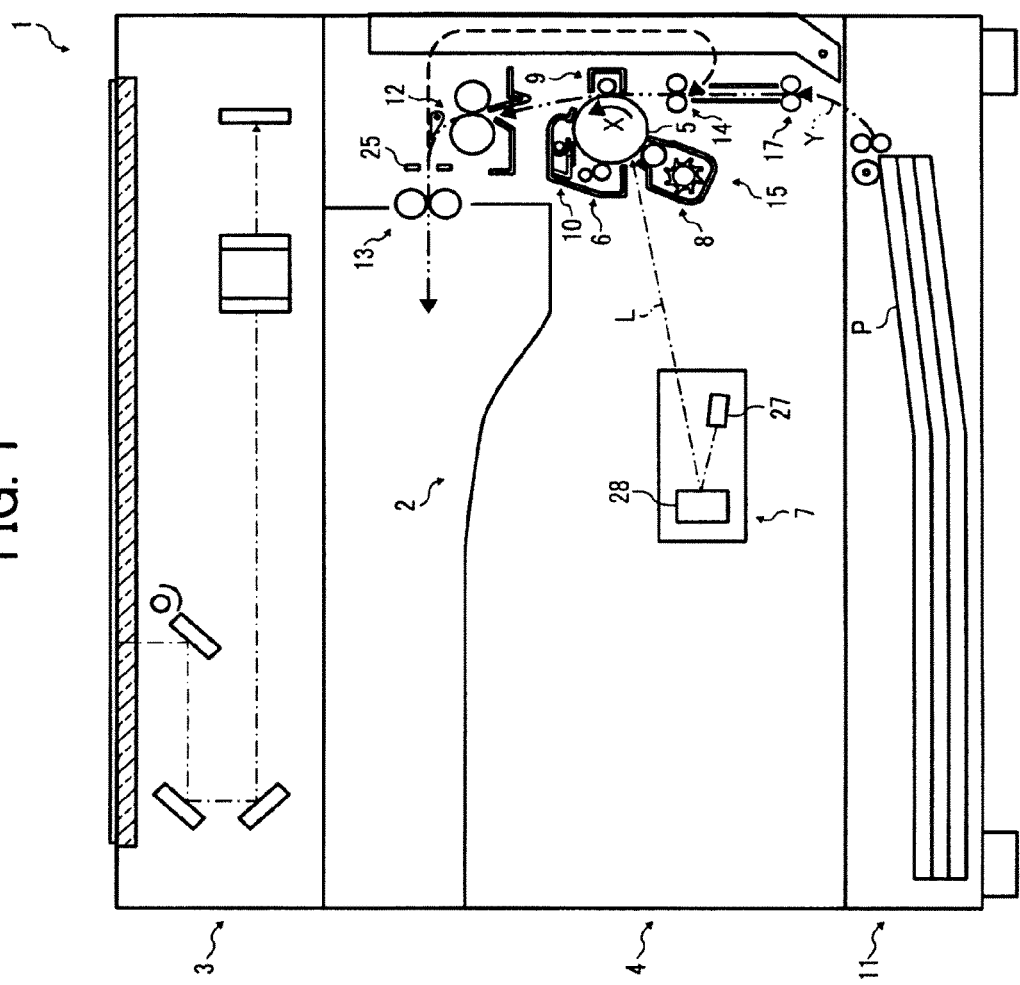
FIG. 1 is a schematic diagram showing an internal configuration of an image forming apparatus according to an exemplary embodiment of the present invention.

Referring now to the drawings, wherein like reference numerals designate identical or corresponding parts throughout the several views.

FIG. 1 is a schematic diagram showing an internal configuration of an image forming apparatus according to an embodiment of the present invention. The image forming apparatus here refers to a laser copying machine, monochrome copying machine including a printer and a facsimile machine, but it can also mean a color copying machine, a facsimile machine, a printer, and a multifunctional copying machine or the like.

The image forming apparatus 1 executes image forming processing based on an image signal of image information received externally, or image data of original material read by the image forming apparatus 1. The image forming apparatus 1 is capable of forming an image on paper, an OHP sheet, a heavy paper such as a card, a postcard, or the like, an envelope or the like.

The image forming apparatus 1 includes an image forming unit 4, a paper output tray 2 arranged on top of the image forming unit 4, a scanner unit 3 arranged on top of the paper output tray 2, a paper feed unit 11 arranged on lower side of the image forming unit 4, a control unit which controls the image forming apparatus 1, an operation panel which displays functions of the image forming apparatus 1 and receives instructions relating image forming, scanning, faxing, or the like, from a user.

The image forming apparatus 1 is a in-body-paper-output type image forming apparatus which has the paper output tray 2 located between the image forming unit 4 and the scanner unit 3 and a paper P that an image has been formed thereon is outputted and stacked on the paper output tray 2.

The image forming unit 4 includes a drum-like photosensitive body 5. The drum-like photosensitive body 5 rotates in a counterclockwise direction X by a main motor as a driving source.

The image forming unit 4 also includes a charging unit 6 which executes a charging process on a surface of the drum-like photosensitive body 5, an exposure unit 7 which exposure beam L is emitted onto the charged surface of the drum-like photosensitive body 5 so as to form a latent image, an image development unit 8 which develops the latent image with toner and visualizes it, a transfer unit 9 which transfers the latent image with toner to the paper P, a cleaning unit 10 which abalates undesired substances such as toner remained on the drum-like photosensitive body 5 after transferring, along with the rotational direction X.

The image forming unit 4 also includes a paper delivery roller 17 which delivers the paper P, which is delivered from an upper side of the delivery direction in the delivery route Y, towards a down stream side of the delivery direction, a resist roller 14 which is arranged between the down stream side in the delivery direction Y of the paper delivery roller 17 and upper side in the delivery direction Y of the transfer unit 9 feeds the paper P to a transfer position which is between the drum-like photosensitive body 5 and the transfer unit 9, a fixation unit 12 is arranged between a down stream side in the delivery direction Y of the transfer unit 9 and an upper side in the delivery direction Y of the paper output tray 2, a paper output sensor 25 detects an output of the paper P to the paper output tray 2 by detecting the passing of the back-end of the paper P in the delivery direction Y, a paper output unit 13, which is a roller capable of rotating forward or reverse, outputs a paper P to the paper output tray 2 when the roller rotates in the forward direction.

The exposure unit 7 includes a laser diode 27, which is a source of laser light, that irradiates the laser light in response to image information or the like of the original material input to the control unit, and a deflection unit 28 which includes reflective optics and imaging optics that reflect the laser lights and images on a surface of the drum-like photosensitive body. The exposure unit 7 irradiates the beam L which is handled by the deflection unit 28 onto the drum-like photosensitive body 5 and forms a latent image on the drum-like photosensitive body 5.

The laser diode 27 is configured to control an emission of light based on the image signal from the control unit, and the control unit controls driving of the laser diode 27 by an image signal which corresponds to a sending signal of the facsimile device or a printing signal of the printer. This makes the image forming device 1 function not only as a copying machine, but also as a digital multifunctional machine having a printing function and a facsimile function. The paper feed unit 11 supplies the paper P which is stacked in the paper feed unit 11 to the image forming unit 4. The fixation unit 12 fixes a toner image onto the paper P by heating and pressurization. A process cartridge 15 includes the drum-like photosensitive body 5, the charging unit 6, the image development unit 8, the cleaning unit 10. The process cartridge 15 further includes a support so as to integrate the drum-like photosensitive body 5, the charging unit 6, the image development unit 8, the cleaning unit 10 together. The support is removable and is arranged on the chassis of the image forming apparatus 1. Consequently, the process cartridge 15 is configured to be removable as a whole.

Figure 2:
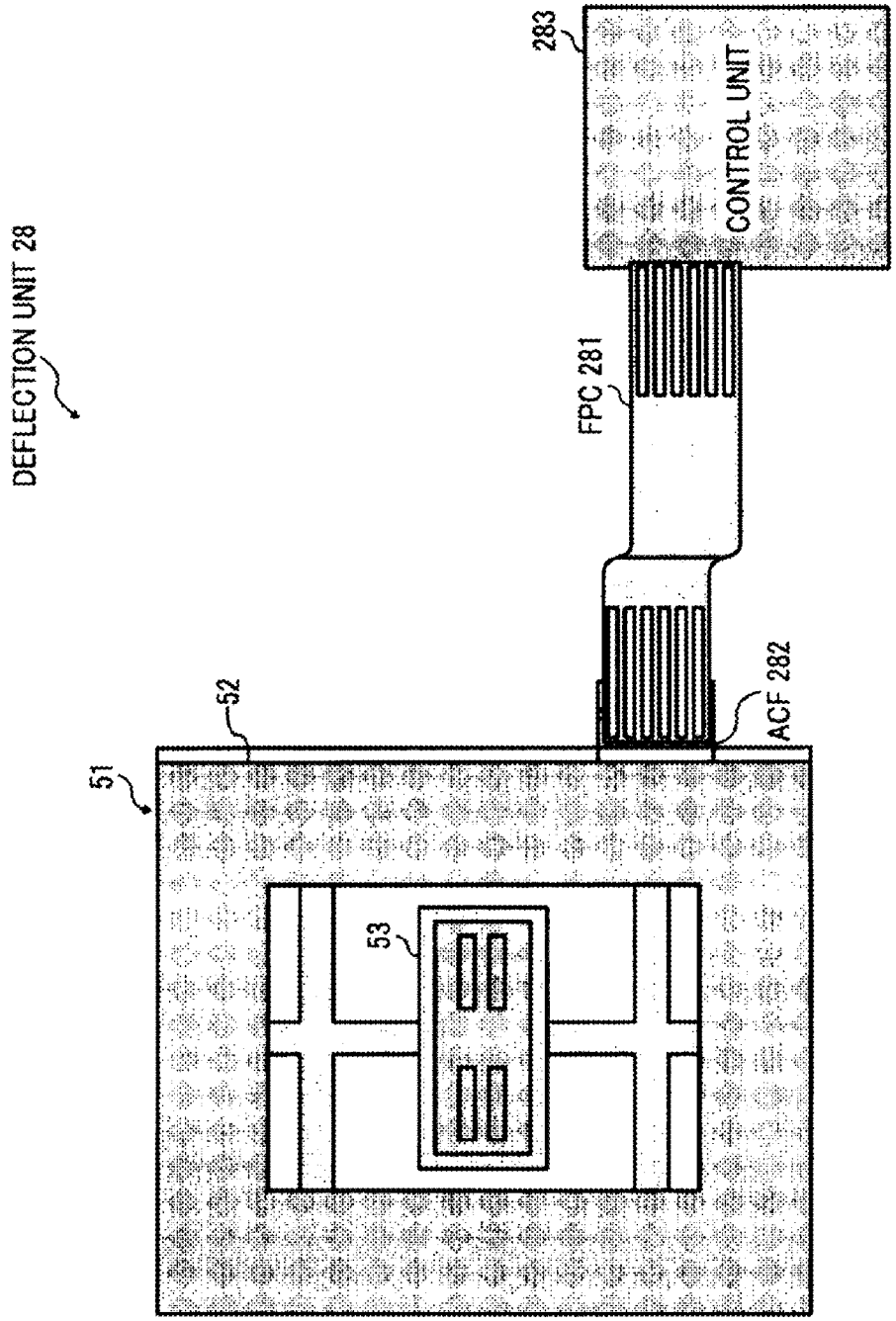
FIG. 2 is a diagram showing a structure of a reflection unit of an exposure unit.

FIG. 2 is a diagram showing a structure of the deflection unit 28 of the exposure unit 7. The deflection unit 28 has a vibration unit 51 that functions as reflective optics to reflect the laser light emitted from the laser diode, Flexible Printed Circuits (FPC) 281 that transmit an electric signal to the vibration unit 51, Anisotropic Conductive Film (ACF) 282 that bonds the vibration unit 51 and the FPC 281 and a control unit 283 controlling power distribution to the FPC 281, driving of the vibration element 53, and deflecting of the laser light. The vibration unit 51 has a frame 52 and a vibration element 53 formed monolithically with the frame 52.

Figure 3:
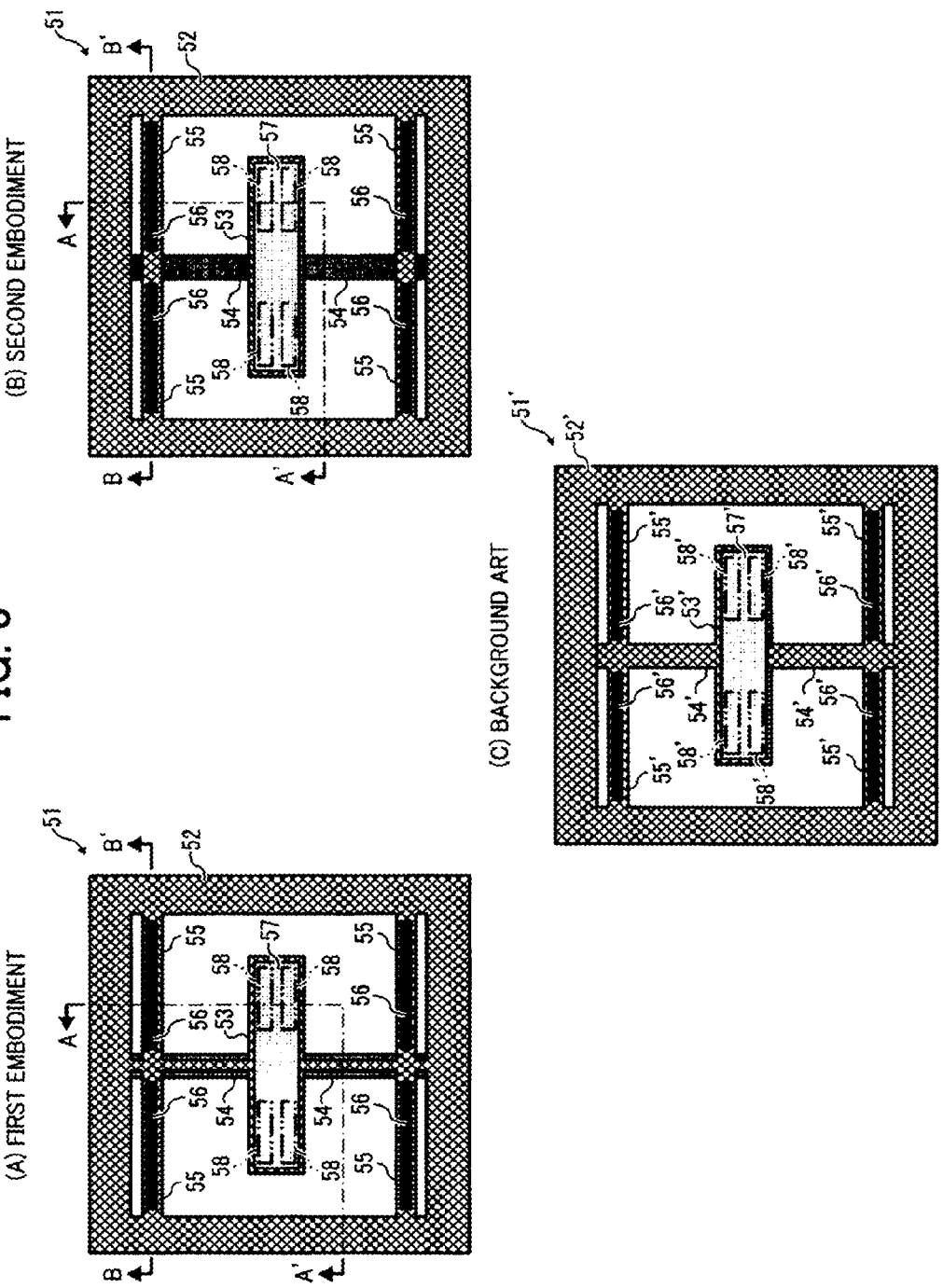
FIGS. 3(A) and 3(B) are diagrams showing a vibration element of exemplary embodiments of the present invention and FIG. 3(C) is diagram showing a conventional vibration element.

FIG. 3 is a diagram showing the vibration unit 51. FIGS. 3(A) and (B) are the vibration unit 51 of the present invention and FIG. 3(C) is a vibration unit 51' that is known in related art. The vibration element 51' includes, for example, a cantilever 55', a driving element 56', a reflective coat 57', and a rib 58'. The vibration units shown in FIGS. 3(A) and (B) respectively correspond to a first embodiment and a second embodiment of the present invention.

The vibration unit 51, functioning as a piezoelectric zirconate titanate (PZT)-driven-type micro-scanner provided on a silicon substrate, includes a frame 52 that is square-shaped, a vibration element 53, located in the center of the vibration unit 51 and is surrounded by the frame 52, vibrates towards the frame 52, torsional beams 54 support the vibration element 53 by connecting both sides of the vibration element 53 to the frame 52 so that the vibration element 53 is capable of fluctuating, cantilevers 55 respectively connect each of the torsional beam 54 to the frame 52 at around one end of the torsional beam 54, a driving element 56, formed on the surface of each of the cantilever 55, is a piezo element which makes the vibration element 53 vibrate via the torsional beams 54 by inflecting a pair of the cantilever 55 in the opposite direction.

The vibration element 53 includes a reflective coat 57 which reflects the laser light emitted from the laser diode 27 on a surface towards the front side of the page in FIG. 2. Therefore the vibration unit 51 functions as an optical element, and this function makes the exposure unit 7 function to form a latent image on the drum-like photosensitive body 5 because of the vibration of the vibration element 53 which causes a deflection of the reflected laser light reflected by the reflective coat 57 to the drum-like photosensitive body 5.

The vibration element 53 has a planar-view square shape in which the center of each border is supported by the torsional beams 54. The reflective coat 57 is formed at the center of the vibration element 53 so as to have a planar-view square shape which is smaller than the vibration element 53.

The vibration element 53 includes two pairs of ribs 58 which are spaces formed in the vibration element 53 on an opposite side of the surface on which the reflective coat 57 is formed within an area of the reflective coat 57 being formed which formed on the other side of the surface. Wherein the two pair of ribs 58 are symmetrically-placed to the supported position with the torsional beams 54.

The rib 58 achieves weight saving with maintaining or improving rigidity of the vibration element 53, so as to improve a response of the vibration of the vibration element 53. The improved rigidity also prevents or restrains warping of the reflective coat 57 while the vibration element 53 is vibrating.

Figure 4:
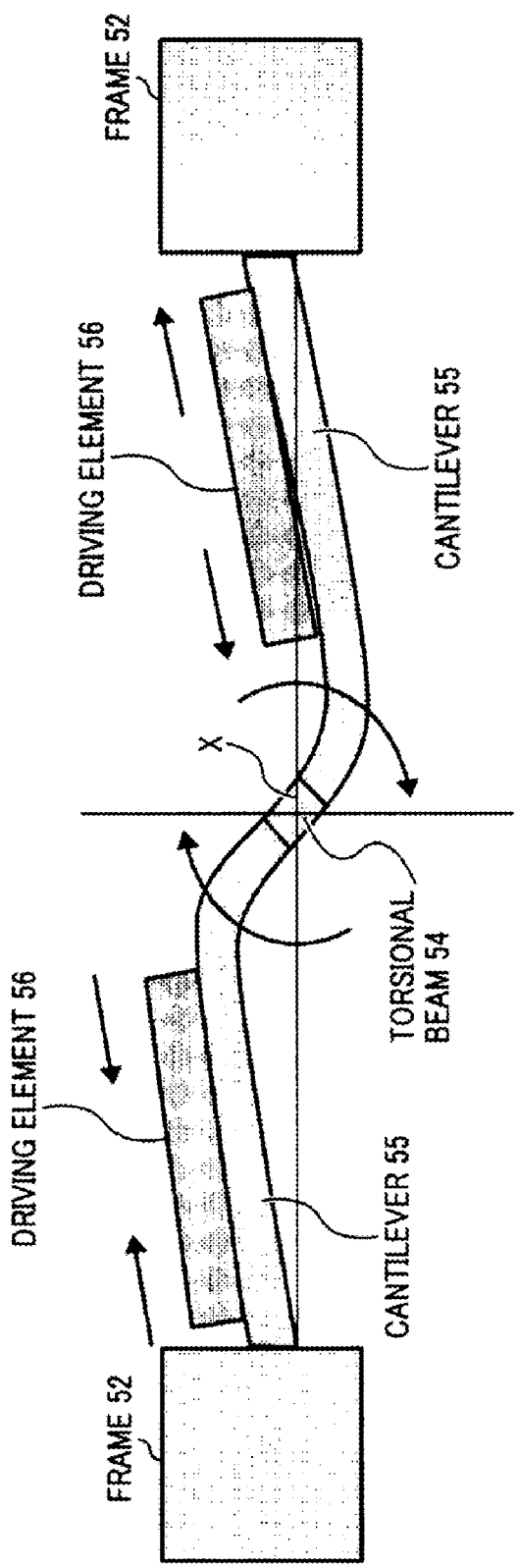
FIG. 4 is a diagram showing a cross section B-B' of the vibration units shown in FIGS. 3(A) and 3(B)

Referring to FIG. 4, vibration of the vibration element 53 is explained. FIG. 4 is a diagram showing a cross section B-B' of the vibration unit 51 shown in FIG. 3. Each driving element 56 is connected to a FPC 281 placed on the frame side of the deflection unit 28. The driving element 56 inflects the cantilever 55 and vibrates the vibration element 53 by a power distribution via the FPC 281 so as to reflect the laser light by the reflective coat 57 and deflect the reflected laser light. The control of power distribution to the FPC 281, driving of the vibration element 53 and deflecting of the laser light are controlled by the control unit 283.

Figure 5:
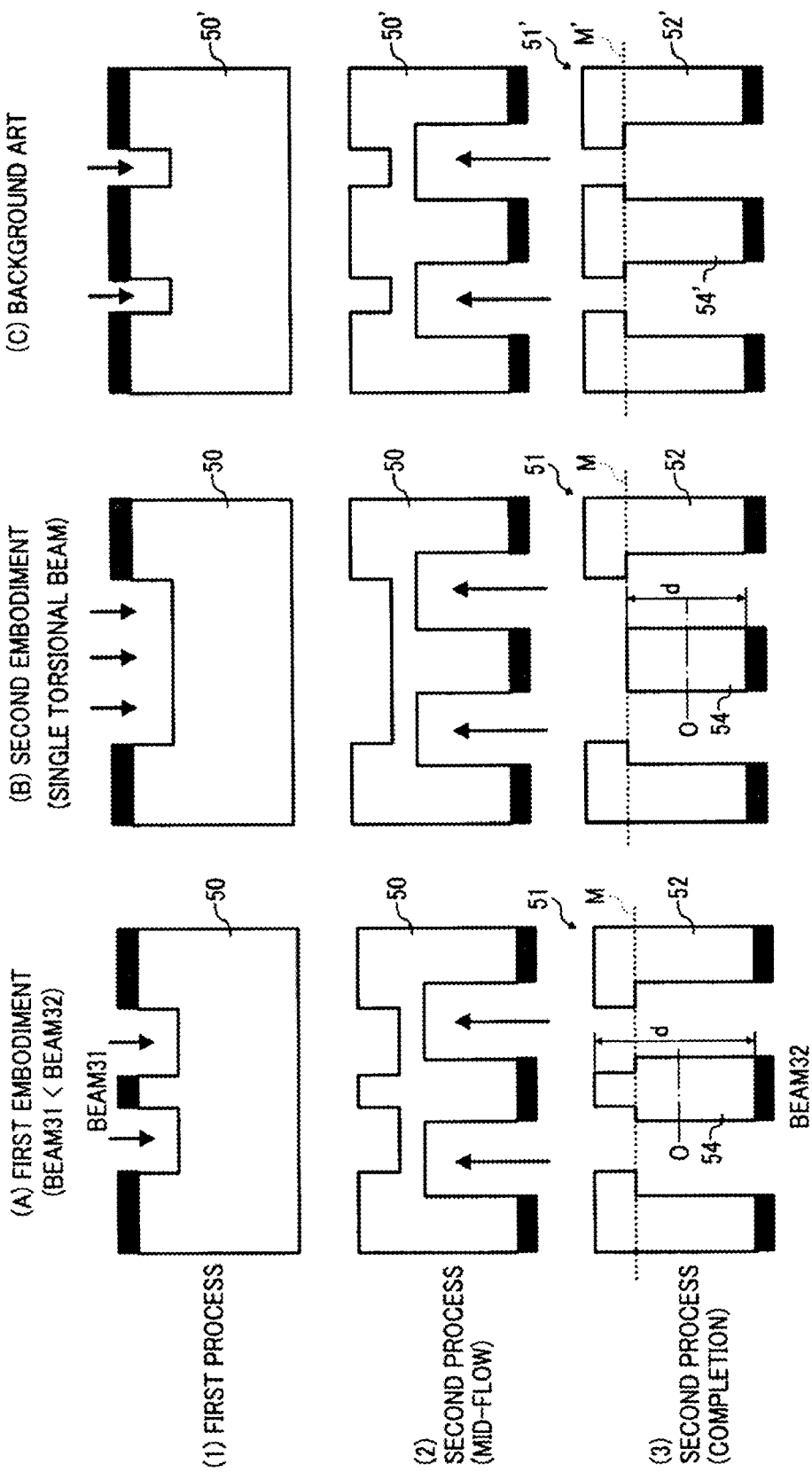
FIGS. 5(A) and (B) are diagrams showing an etching process to form a vibration element of the present invention and FIG. 5(C) is a diagram showing an etching process to form a conventional vibration element.

As shown in FIG. 5, the frame 52 and the torsional beam 54 of the vibration unit 51 are formed by etching from both sides of a silicon substrate 50. The vibration element 53 is also formed in the etching process. Etching a substrate from both sides is a well-used method to form several types of elements on a silicon wafer.

FIG. 5 is a diagram showing a first embodiment and a second embodiment of the vibration element 53. Similar to FIG. 3, FIGS. 5(A) and (B) are the vibration unit 51 of the present invention and FIG. 5(C) is a vibration unit 51' that is known in related art.

In FIG. 5, a black-marked-out layer indicates a resist with a predetermined pattern which is formed on the surface of the substrate 50 when etching is applied. The resist is in a shape which is unionized the frame 52, the vibration element 53 and the torsional beam 54.

As shown in FIG. 5, the vibration unit 51 and 51' are formed in a process including a first etching process and a second etching process. The first etching process applies etching to an upper surface in FIG. 5 toward a direction that the downward arrow indicates, and wherein the second etching process applies etching to a lower surface in FIG. 5 toward a direction that the upward arrow indicates.

In the process step shown in FIG. 5(C), a symbol M indicates a meeting point where an etching of the first etching process and the second etching process meet. The meeting point M can be rephrased as a position in the substrate when the etching of the first etching process and the second etching process communicate with each other.

The shape of the meeting point M' of the vibration unit 51' is explained with reference to FIG. 6. However, the shape of the meeting point M' is desired to be flat in both the frame 52' and the torsional beam 54' as shown in FIG. 6(A). However, in actuality a notch exists at the meeting point M' in both the frame 52' and the torsional beam 54' as shown in FIG. 6(B). The reason that the meeting point M' has a notch is because of over-etching of the substrate 50' which is required to reliably pass through the substrate 50' by etching, due to dispersion in thickness of the substrate 50' and the accuracy of etching.

Figure 7:
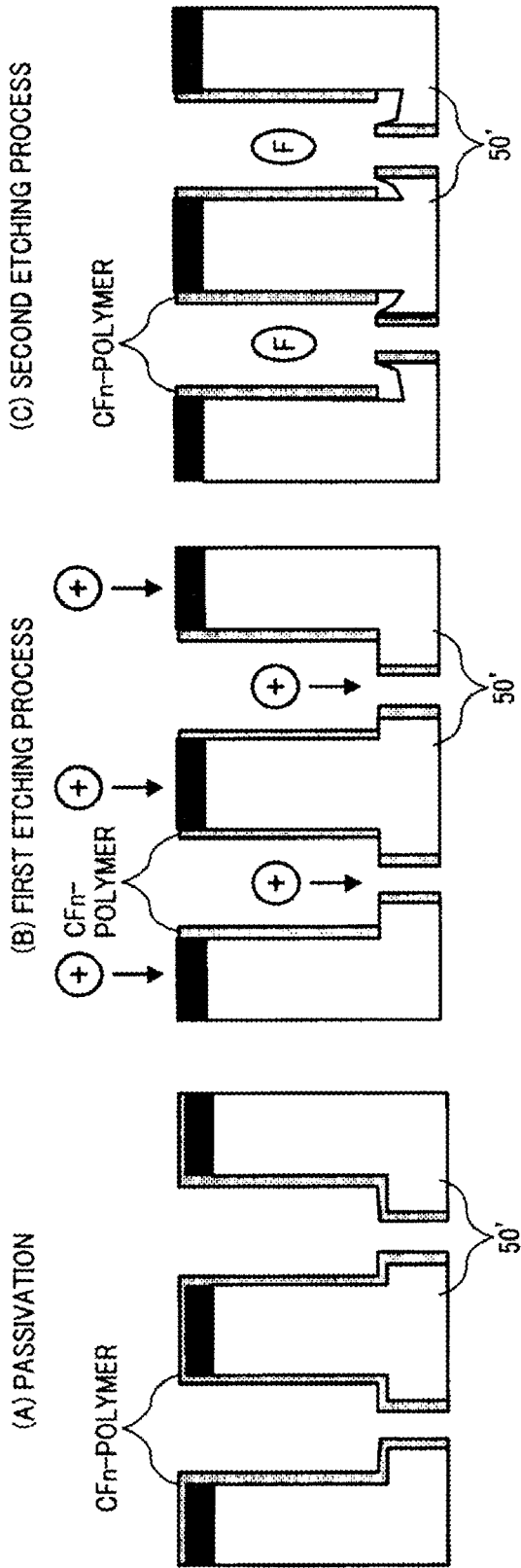
FIG. 7 is a diagram showing a notch generating mechanism.

Processes that generate the notch are explained with reference to FIG. 7. Etching processes described next are an ICP etching in a Bosh process which is generally used to apply etching on a silicon substrate in the MEMS (Micro Electro Mechanical Systems) field of technology. The Bosh process is a process that enables deep etching without widthwise expansion by alternately and rapidly applying an etching process and a passivation process, in other words, the Bosh process is an etching process which repeatedly executes processes in FIG. 7(A) to (C).

Namely, a passivation process creates a passivation film of a CFn polymer as a surface protective film of the substrate 50' takes place as shown in FIG. 7(A). Then an etching process takes place to remove the passivation film using directional ions as shown in FIG. 7(B). An etching process takes place to remove a silicon surface using an F radical, wherein the silicon surface is denuded by the removing of the passivation film, as shown in FIG. 7(C). These processes (A) to (C) are repeated so that the vibration unit 51' is formed.

In these processes, it is not problematic if the etching took place conformal and the shape at the meeting position M' is in ideal condition as shown in FIG. 6(A), when the over-etching occurred as abovementioned. However, a notch would be generated and the shape at the meeting position M' would be a shape with the notch as shown in FIG. 6(B), when the etching process using F radical took place as shown in FIG. 7(C). Notches like these could be problematic especially for the torsional beam 54', because these notches could decrease the strength of the torsional beam 54' and may cause destruction of the torsional beam 54'.

Figure 8:
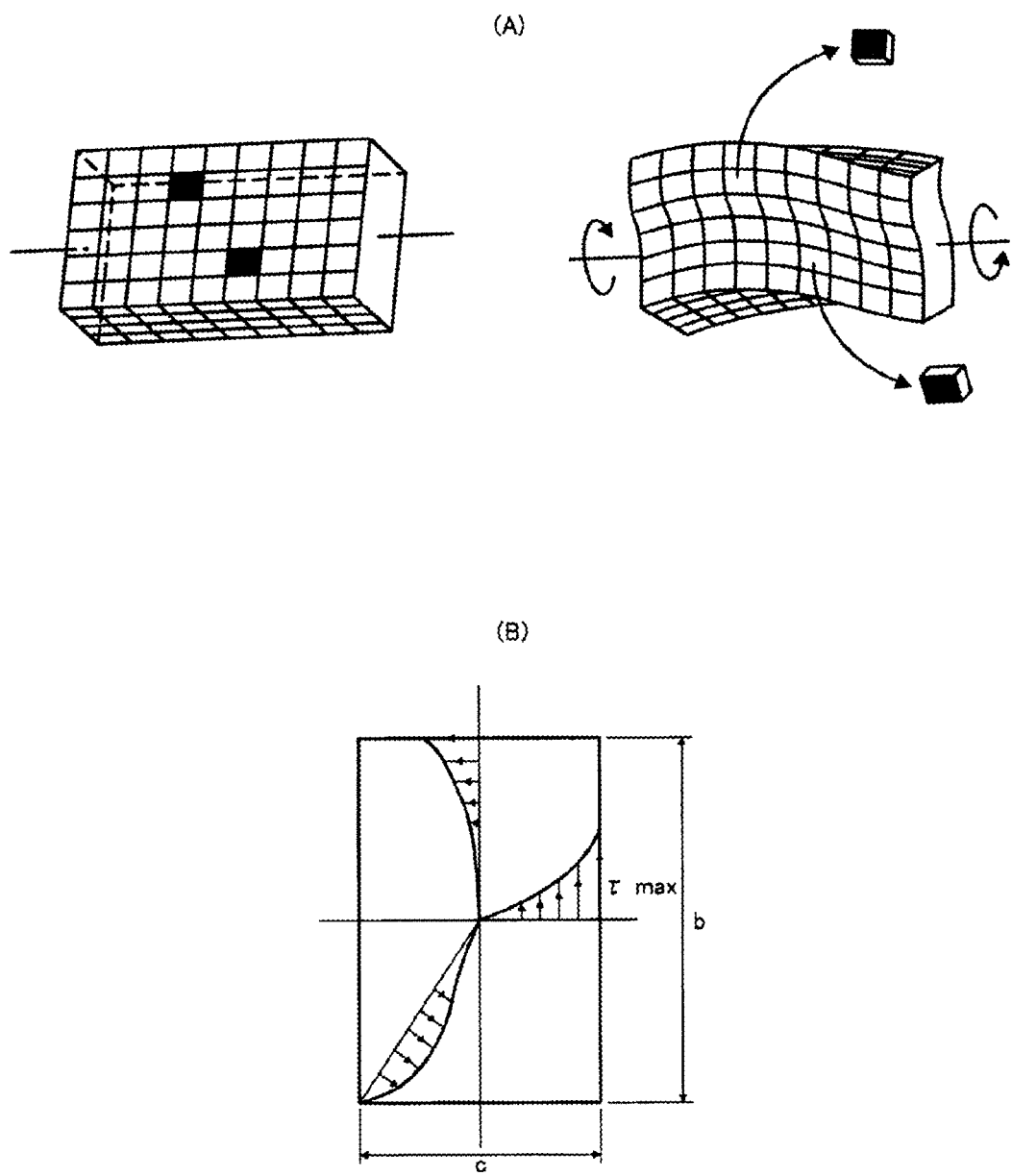
FIGS. 8(A) and (B) are diagrams showing a mechanism of shear stress.

FIG. 8 is a diagram showing a shear stress, which could be one of the causes for the destruction of an element which has a rectangular shape like the torsional beam 54', at the time that the element twisted.

As shown in FIG. 8(A), when a torque is added to the rectangular solid shaped element, the element is twisted. The cross-sectional surface having a long side b and a short side c which are respectively perpendicular to axes become deflected and become non-rectangular in shape. As shown in FIG. 8(B), distribution of shear stress in three radial directions that come out from the center of the cross-section surface are shown by arrows in FIG. 8(B) and the maximum shear stress occurs at midpoint of the long side b. The shear stress at the corners of the cross-sectional surface is 0. The maximum shear stress $\tau_{max}$ is defined as $\tau_{max}=T/\alpha bc2$, wherein T stands for the torque added, and $\alpha$ stands for a parameter determined by calculating b/c.

The direction of the long side b of the cross-section surface in FIG. 8(B) corresponds to the width direction of the substrate 50'. Therefore, when the notch is in the center of the torsional beam 54' in the width direction of the substrate 50', destruction of the torsional beam 54' most easily occurs as the maximum shear stress by vibration of the vibration element 53' is created at the location of the notch.

Then, the first etching process and the second etching process take place so that the vibration unit 51 has meeting position M which differs from the center position O of the torsional beam 54 in a width direction of the substrate 50. Therefore, the mechanical strength of the torsional beam 54 is greater when the meeting point M and the center position O do not coincide.

Thus, the first etching process and the second etching process take place so that the meeting point M is shifted from the center position O of the torsional beam 54 in a width direction of the substrate 50. The shifted length is set to more than equal to d/4 from the center position O. The variable d denotes the width of the torsional beam in a width direction of the substrate 50 as shown in FIGS. 5(A) and (B).

The reason for setting the meeting position M more than d/4 distanced from the center position O of the torsional beam 54 is that the influence of the maximum shear stress that occurs in the torsional beam 54 is reduced to a negligible amount at that position as represented in FIG. 8(B).

The first etching process and the second etching process take place to build up the vibration unit 51 so that the vibration unit 51 does not have notches at the meeting point by setting the width of the torsional beam 54 in the second etching wider than the width of the torsional beam 54 (width of the beam 1 in FIG. 5(A)) in the first etching process.

This brings the shape of the vibration unit 51 at the meeting position M to the ideal shape as shown in FIG. 6(A) and prevents a reduction of strength of the torsional beam 54 by notches. Because of alignment error in etching from each side of the substrate, it is not avoidable for the element, like the vibration unit 51, built up with etching from both sides of the substrate from position error that occurs at the meeting position in a direction perpendicular to the width direction of the substrate.

In the second embodiment of the vibration unit 51, the vibration unit 51 has a shape with the same grade by setting the width of the torsional beam 54 in the first etching process to 0 and the meeting position M at the end of the torsional beam 54. This strengthens the torsional beam 54 enormously. Thus, there is an advantage in making the torsional beam 54 thicker in the width direction of the substrate 50, since the vibration element of the first etching process is thick in width.

Therefore it has an advantage in strengthening the torsional beam 54 by thickening the width of the torsional beam 54, if it can prevent error in position from the etching process with accuracy.

Each abovementioned exemplary embodiment of the vibration unit 51 is built as the length from a first surface of the substrate 50 to the meeting position M (depth in etching of the second etching process) is greater than the length from a second surface of the substrate 50 to the meeting position M (depth in etching of the first etching process). This stabilizes the etching characteristic and facilitates mid-flow processes.

Figure 9:
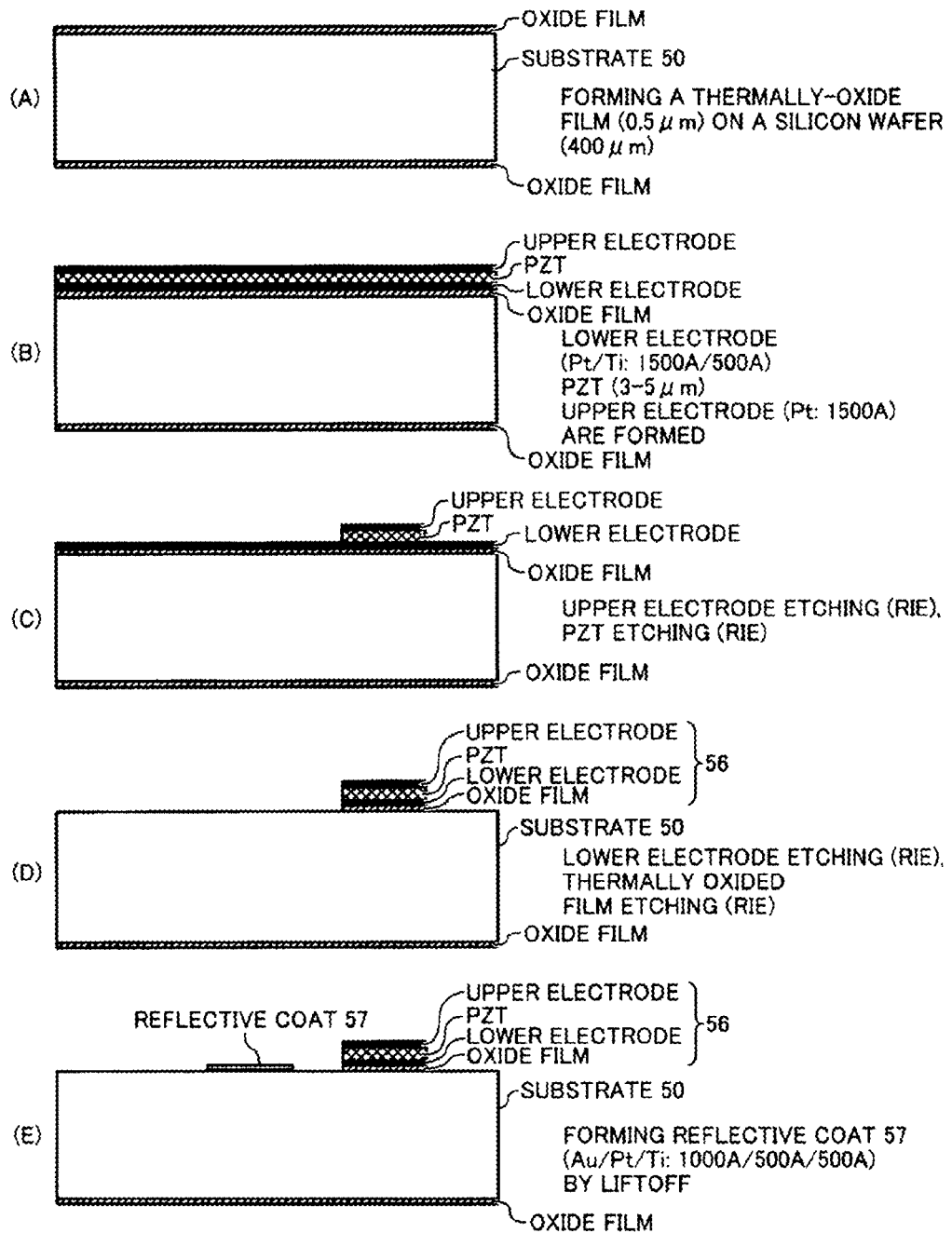
FIG. 9 is a diagram showing a PZT process which is the pre-process of a first etching process and second etching process.
Figure 10:
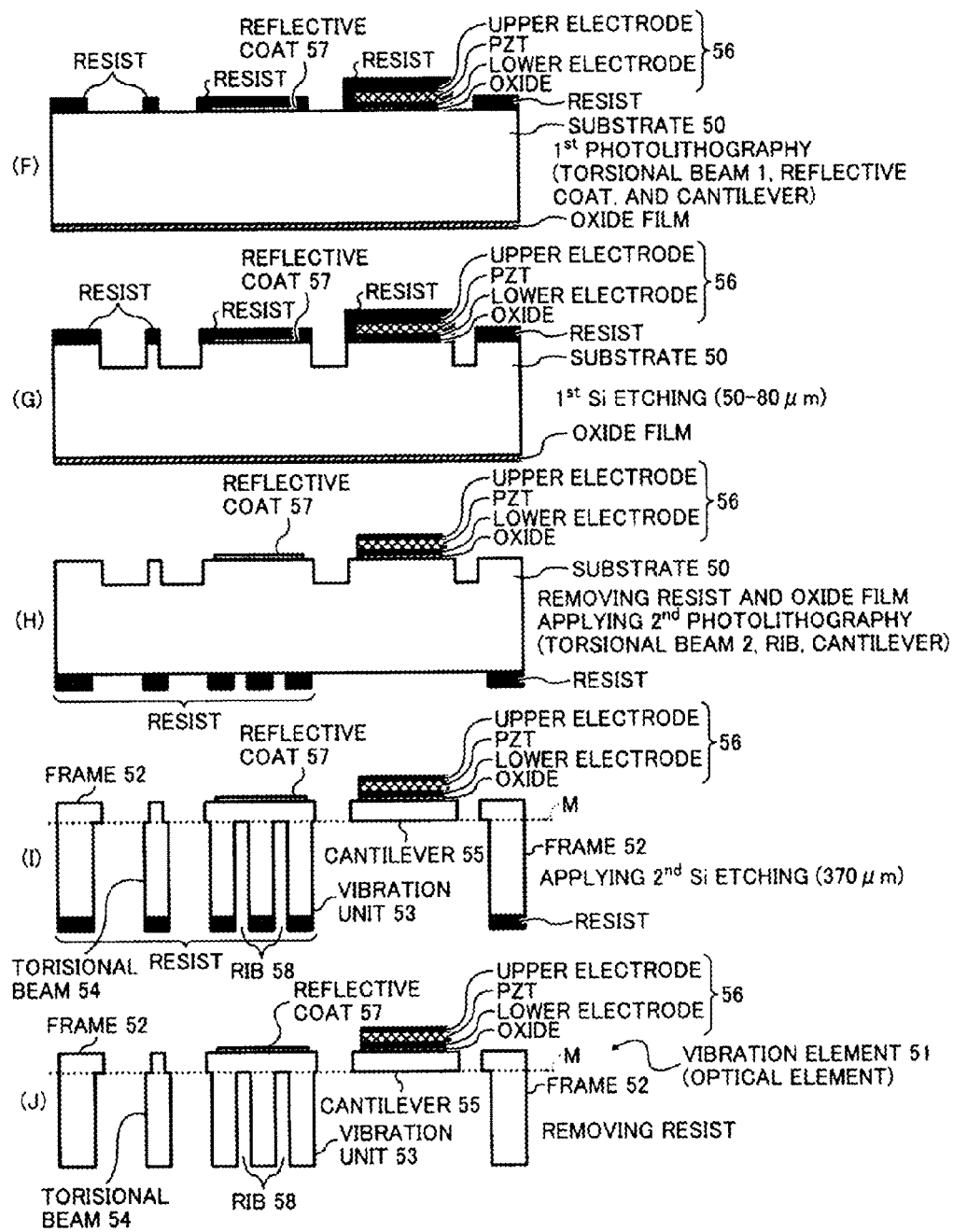
FIG. 10 is a diagram showing a process of the vibration element of the first embodiment.
Figure 11:
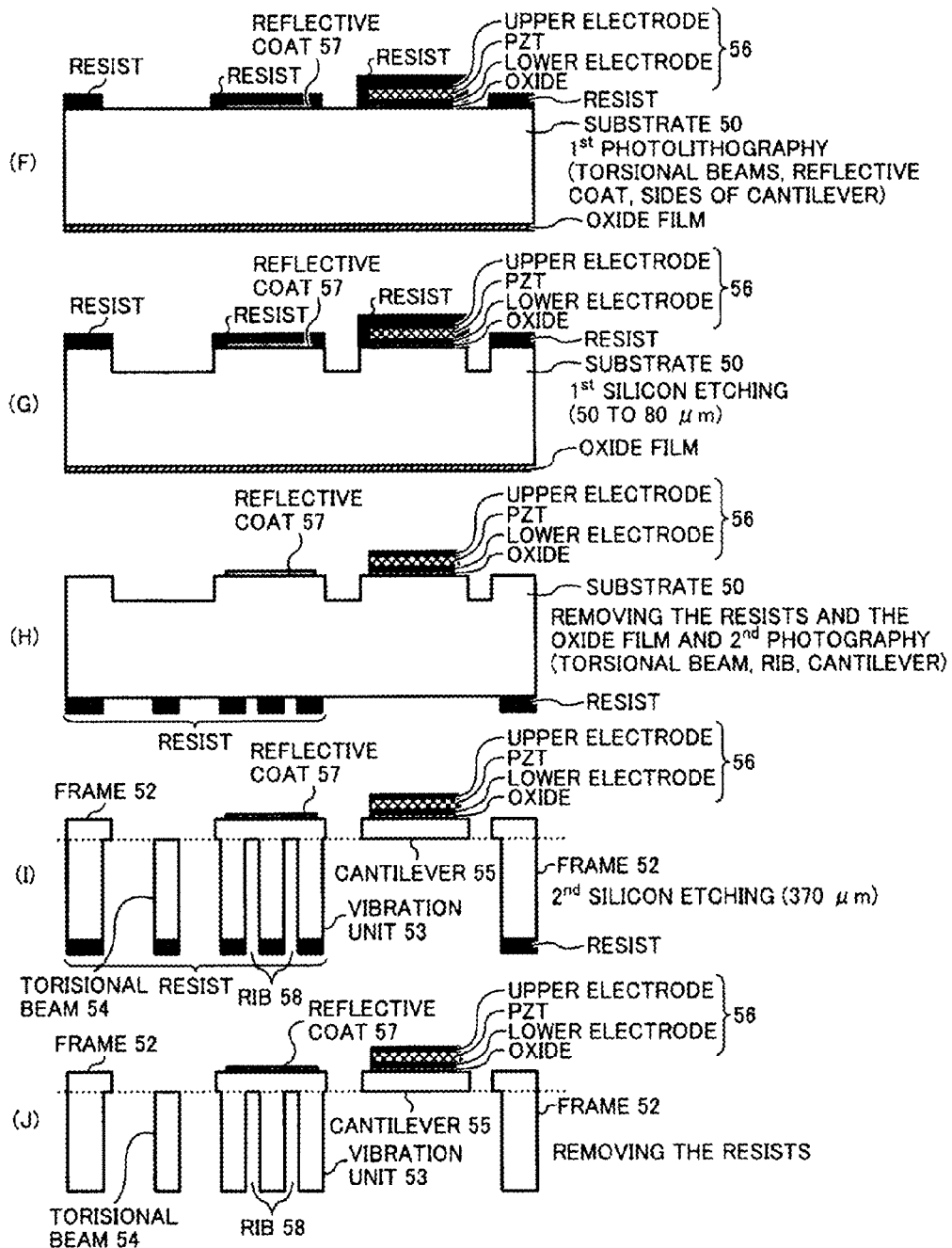
FIG. 11 is a diagram showing a process of the vibration element of the second embodiment.

A detailed manufacturing process of the vibration unit 51 is explained with reference to FIG. 9 to FIG. 11. This manufacturing process uses a similar technique as explained in FIG. 7. FIG. 9 to FIG. 11 shows the cross-section A-A' shown in FIG. 2. FIG. 9 is a diagram showing a PZT process which is the pre-process of a first etching process and a second etching process and which is commonly used as a pre-process for the first and the second embodiment of the vibration unit 51. FIG. 10 is a diagram showing a process of the first embodiment of the vibration unit 51, which is applied to the substrate 50. FIG. 11 is a diagram showing a process of the second embodiment of the vibration unit 51, which is applied to the substrate 50.

In a PZT process, a thermal-oxide film which is for insulating is formed onto the substrate 50 (silicon wafer) with 0.5 μm in thickness as shown in FIG. 9(A). Then, a lower electrode, PZT ("piezoelectric zirconate titanate") film and upper electrode are formed in series onto the thermal-oxide film as shown in FIG. 9(B).

The lower electrode is made of a 0.05 μm Ti (Titanium) layer in thickness and a 0.15 μm Pt (Platinum) layer in thickness. The PZT layer has a 3 μm thickness. The upper electrode is made of a 0.15 μm Pt (Platinum) layer in thickness.

Sputtering, for instance, is used for film formation of the lower and the upper electrode, and sputtering, CVD (Chemical Vapor Deposition), ion-plating or the like are used for film formation of the PZT.

Then, a dry etching process takes place onto the upper electrode and PZT by RIE (Reactive Ion Etching) after photolithography process takes place, as shown in FIG. 9(C). Further, a dry etching process takes place onto the lower electrode and oxide film by RIE after the photolithography process takes place, as shown in FIG. 9(D). Then, the driving element 56 shown in FIG. 3 is formed.

Further, a reflective coat 57 is formed on the substrate by applying a liftoff process, as shown in FIG. 9(E). The reflective coat 57 is made of 0.05 μm Ti (Titanium) layer in thickness, 0.05 μm Pt (Platinum) layer in thickness, and 0.1 μm Au (Gold) layer in thickness, and the layers are formed in this series.

In the process of the first embodiment of the substrate 50 shown in FIG. 10, following the process shown in FIG. 9(E), a masking process takes place to form a resist onto regions on the upper surface of the substrate 50 corresponding to the frame 52, the vibration element 53, and the torsional beam 54 so that they are covered with the resist after the photolithography process takes place, as shown in FIG. 10(F).

Then a first silicon etching process takes place as shown in FIG. 10(G). The first silicon etching process corresponds to the abovementioned first etching process.

Following the process shown in FIG. 10(G), the mask (resist) formed on the upper surface of the substrate 50 and the oxide film formed on the lower surface of the substrate 50 are removed, and a masking process takes place to form a resist onto regions on the lower surface of the substrate 50 corresponding to the frame 52, the vibration element 53 (excluding the region that corresponds to the rib 58), and the torsional beam 54 so that they are covered with the resist after the photolithography process takes place, as shown in FIG. 10(H).

Then second silicon etching process takes place as shown in FIG. 10(I). The second silicon etching process corresponds to the abovementioned second etching process.

As a result, the vibration unit 51 as an optical element is obtained by removing the mask formed onto the lower surface of the substrate 50.

FIG. 11 is a diagram showing the second etching process of the second embodiment of the vibration unit 51. In the process of FIG. 11, the second etching process has a similar process as the second etching process in FIG. 10, but the photo-mask used for photolithography is different.

As a result of this process, however, the height difference in the meeting position does not occur in the torsional beam 54 itself, there is a minor height difference between the torsional beam 54 and the vibration unit 53 which occurs by the first etching process as shown in FIG. 3(B).

Since this height difference is located close to the upper surface of the vibration unit 51, the possibility of destruction by shear stress is reduced. Such height difference also occurs to the vibration unit 51 as shown in FIG. 3(A), but its height difference is smaller than FIG. 3(B). Therefore, the influence of destruction by shear stress is much less than the vibration unit 51 of FIG. 3(B).

These processes allow the vibration element to be manufactured at a relatively low cost.

<Third Embodiment>

A micro scanner (optical scanning device) using the torsional beam 54 of the present invention will now be explained. The PZT-driven type micro scanner will also be explained.

Figure 12:
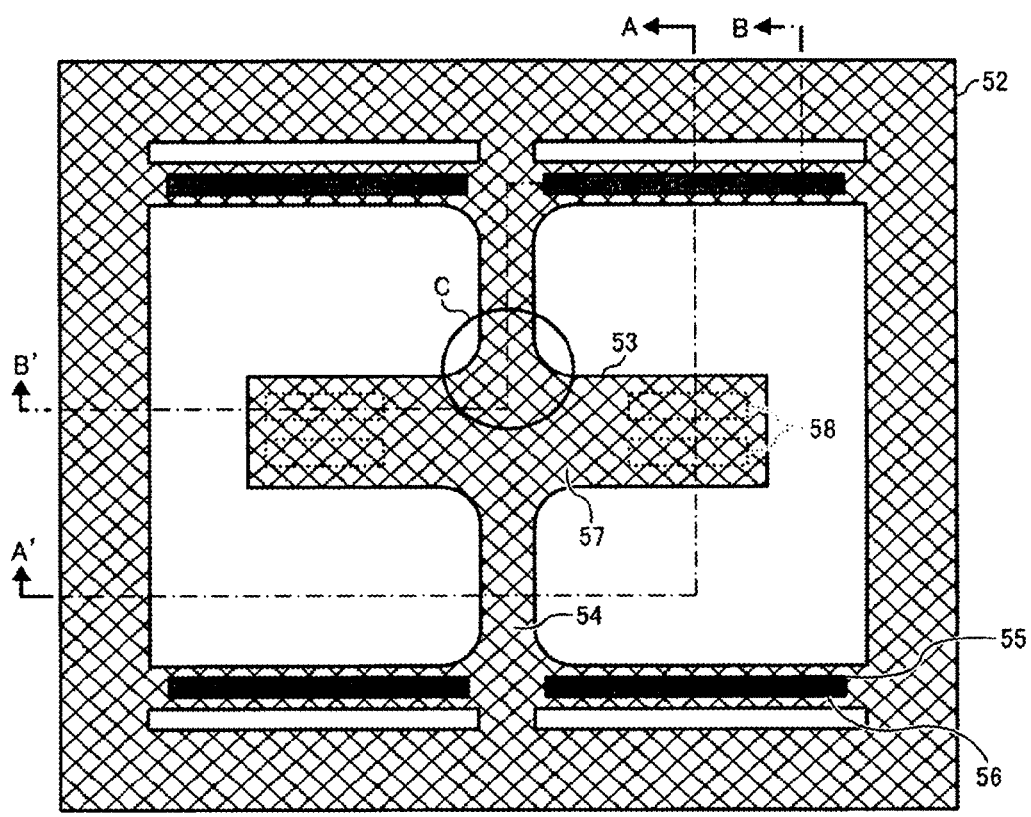
FIG. 12 is a top view diagram of a micro scanner

FIG. 12 is a diagram of a top view of a micro scanner.

In FIG. 12, elements that are the same as in FIG. 3 have the same reference numbers and an explanation of these elements is abbreviated.

A tensile stress which is one of the causes of destruction of the torsional beam 54 will now be explained.

The tensile stress is a stress that occurs at the end of the torsional beam 54.

As shown in circle C in FIG. 12, a joining section of the reflective coat 57 and the vibration element 53 has a curved shape. This shape is for the purpose of absorbing the concentration of stress and can be easily formed by a photolithography pattern.

For the purpose of absorbing the concentration of stress, it is more effective to have a thickness distribution in the width direction of the torsional beam 54. Most preferable is a curve in the width direction at the end of the torsional beam 54 (joining section with the reflective coat or the like).

To produce a thick reflective coat 57 (Its width is set to 400 μm to reduce dynamic deformation) as disclosed herewith from a silicon substrate at low cost, an etching process from both sides is applied so as to form a thin torsional beam. Some reasons why a thin torsional beam is advantageous is so you can obtain a larger deflection angle, and to set a resonance frequency or the like. In this case, it enables the torsional beam to have thickness distribution in the width direction and to absorb the concentration of stress.

Figure 13:
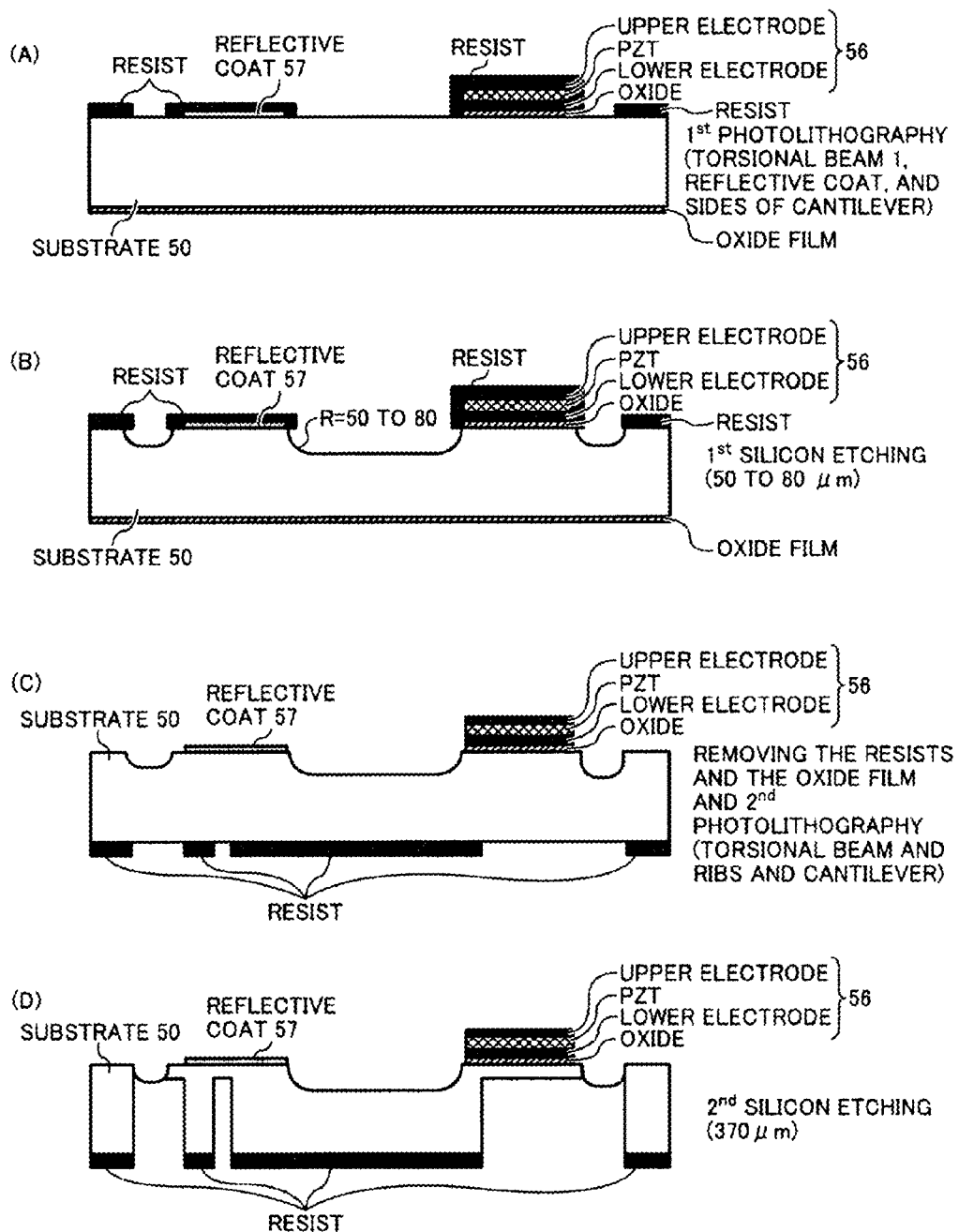
FIG. 13 includes diagrams showing a manufacturing process of the vibration element of a third embodiment.

FIGS. 13(A) and 13(B) are diagrams showing a manufacturing process for the vibration unit 51 of the present embodiment. For the purpose of showing a thickness distribution of the torsional beam 54, FIGS. 13(A) and 13(B) show a cross-section B-B' shown in FIG. 12. The PZT process is abbreviated since it is similar to that described in FIG. 9.

The basic manufacturing process is similar to the FIG. 11, however, a condition for the first silicon etching process (FIG. 11(G)) is changed. Using isotropical-etching (for instance, parallel plate type RIE condition which the anisotropic aspect is not so high, or a condition which does not have the passivation process in FIG. 7) not anisotropical-etching, it allows the curving of the end of the torsional beam 54 in the width direction (down-turned).

In the manufacturing process, there are two silicon etching processes in which etching conditions are different from each other. The first etching process (FIG. 13(B)) uses isotropical-etching to define the thickness of the torsional beam 54 (curving in the width direction), and the second etching process (FIG. 13(D)) uses anisotropical-etching to define the width of the torsional beam 54.

In addition, there is no grade difference in the torsional beam 54 produced by a process of the third embodiment in a similar manner as shown in FIG. 11, if it is observed from cross-section A-A' in FIG. 12.

As shown in FIG. 13(B), if isotropically-etching (a) takes place for 50 μm, then a curve having a curvature radius R=50 μm is obtained at the end of the etching mask (b). The R is preferred to form more than 10 μm rather than a few μm that can not be avoidable in a normal process. However, a length of the torsional beam 54 depends on how the resonance frequency is set, the length of the torsional beam 54 will be about 4mm in the case where it is set to 3 kHz. In this case, a change in the frequency of thickness affected by the R at the end of the torsional beam 54 will be small enough to not cause a problem. Therefore this process is effective for avoiding a change in the resonance frequency.

The above structure in which the torsional beam 54 has no grade difference and distribution in a width direction has the same effect as the vibration unit 51 of the second embodiment (FIG. 11) with regard to the shear stress, and it also has an effect for avoiding concentration of the tensile stress. Further, since the etching surface of the torsional beam 54 can be flat and smooth by applying isotropical-etching for the first etching process, the concentration of stress can be more avoidable.

<Fourth Embodiment>

Figure 14:
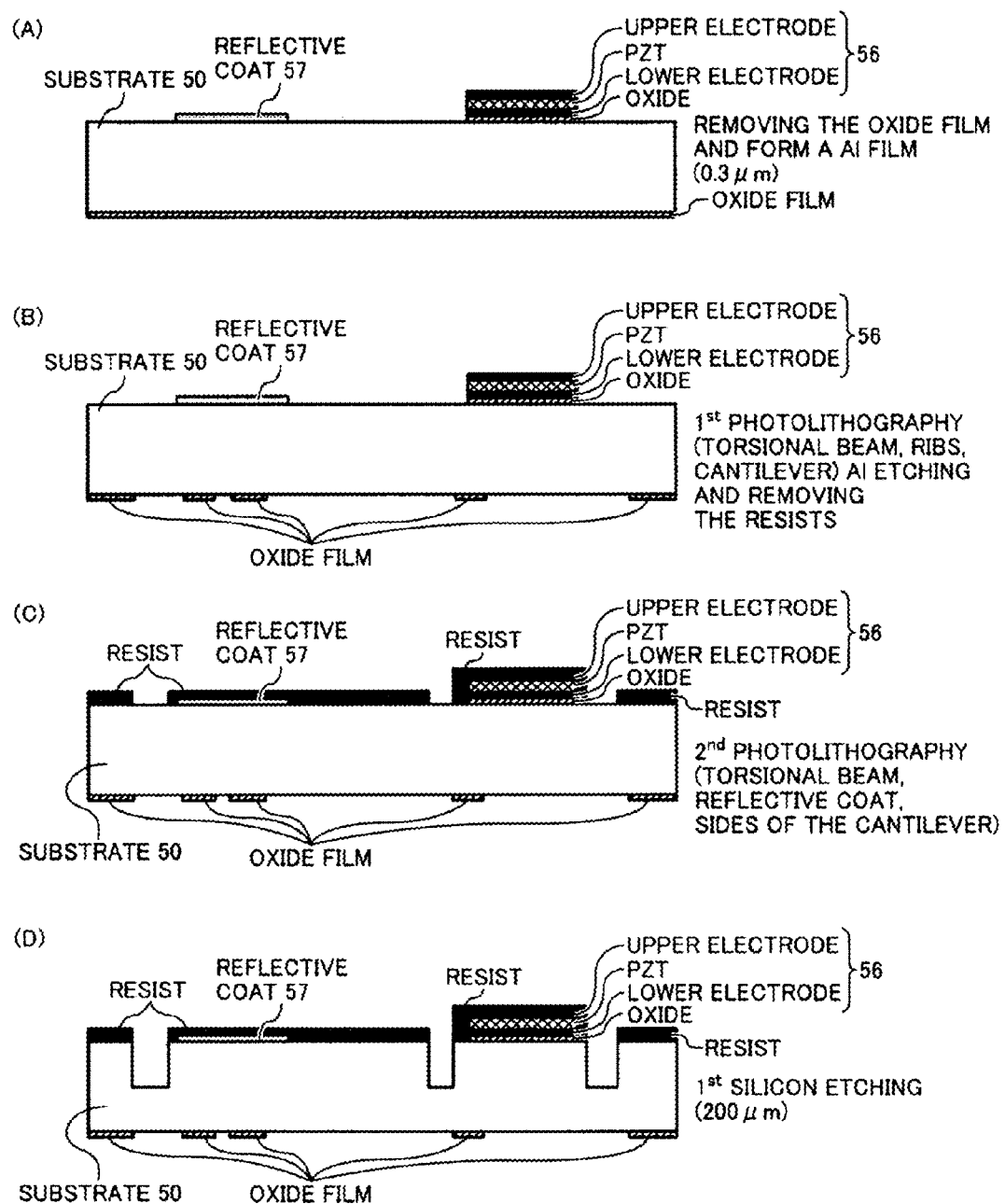
FIG. 14 includes diagrams showing a manufacturing process of the vibration element of the fourth embodiment.
Figure 14:
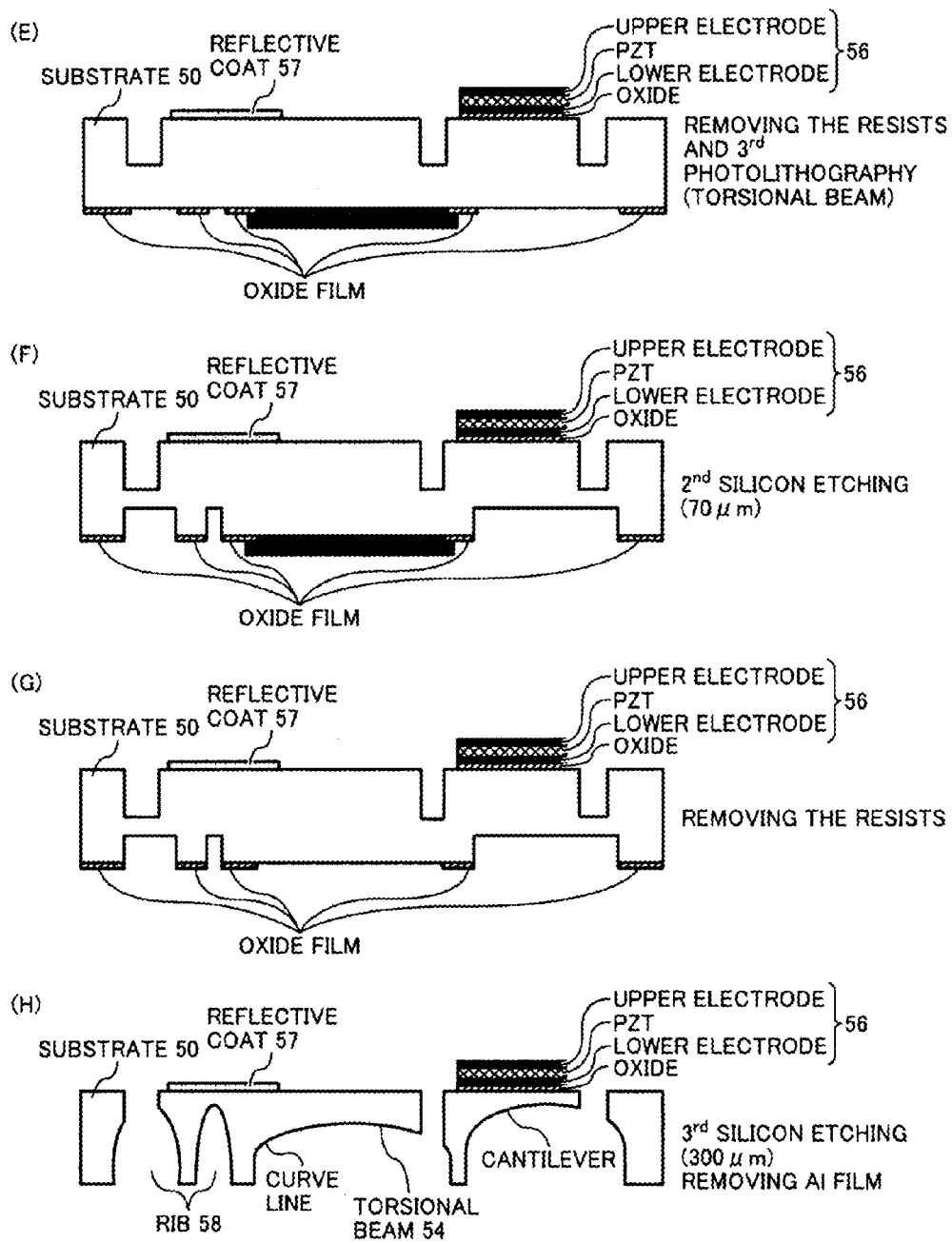

FIGS. 14(A) and 14(B) are diagrams showing a manufacturing process of the vibration element of a fourth exemplary embodiment of the present invention.

In this exemplary embodiment, a position of the curved line of the torsional beam 54 is different from the third embodiment.

However, the position of the curved line of the torsional beam 54 which is connected to the reflective coat 57 is changed, it is preferable for the PZT driven type micro scanner to be at this embodiment so as to transmit drive torque to the torsional beam 54 efficiently.

In this embodiment, the number of times of the silicon etching increases to three times and the process become complicated, so an aluminum mask is used for an etching mask to implement this embodiment, for example.

In this embodiment, an isotropical-etching process takes place for a third etching process. In the third etching process, if there is a sizing problem with overgrown side-etching, the third etching process can be designed that the anisotropical-etching first takes place, and then the isotropical-etching takes place for the last part of the third etching process.

Since the vibration unit 51 is made of a normal silicon substrate rather than SOI (Silicon On Insulator) which has a simple phase and hardness but is cost consuming, it can be produced at low cost.

Moreover, an optical scanning device with a high deflection angle can be obtained by using a tough torsional beam 54.

The vibration element of the present invention may have either a structure having the meeting position at the position different from the center position of the torsional beam 54 in a width direction of the substrate or a structure having a width of the torsional beam defined by the second etching process larger than a width of the torsional beam defined by the first etching process.

In case the vibration element have the former case, the first etching process and the second etching process may be in reverse order.

The vibration element of the present invention can be used for an optical scanning type barcode reading device, a laser radar device for automobile use, or the like. And the vibration element of the present invention can be used for other uses other than the optical element. In that case, the reflection coat can be abbreviated.

The effects described in the preferred embodiments of the present invention are enumeration of preferred effects can be obtained from the present invention, and the effects of the present invention may not be limited to the description described in the preferred embodiments.

Numerous modifications and variations of the present invention are possible in light of the above teachings. It is therefore to be understood that within the scope of the appended claims, the invention may be practiced otherwise than as specifically described herein.

The invention claimed is:

1. A vibration unit, comprising:
   a frame;
   a vibration element configured to vibrate and with a substrate having a first etched surface formed on a top surface of the substrate and a second etched surface formed on a bottom surface of the substrate, the first etched surface and the second etched surface communicate with each other at a meeting point located at a position other than a center position in a thickness direction of the substrate of the vibration element; and
   a beam connecting the vibration element to the frame.

2. The vibration unit according to claim 1,
   wherein the meeting point is located at a position which is more than d/4 apart from the center position of the vibration element, wherein d is a measured thickness of the vibration element.

3. The vibration unit according to claim 1,
   wherein a width of the beam between the second etched surface and the meeting point is larger than a width of the beam between the first etched surface and the meeting point.

4. A vibration unit, comprising:
   a frame;
   a vibration element configured to vibrate and with a substrate having a first etched surface formed on a top surface of the substrate and a second etched surface formed on a bottom surface of the substrate, the first etched surface and the second etched surface communicate with each other at a meeting point located at a position other than a center position in a thickness direction of the substrate of the vibration element; and a beam connecting the vibration element to the frame, and the beam has a first surface on a top portion of the beam and a second surface on a bottom portion of the beam, and a width of the beam at the first surface is smaller than a width of the beam at the second surface.

5. The vibration unit according to claim 4,
wherein the beam has a first height from the second surface to a meeting point larger than a second height from the first surface to the meeting point, wherein the meeting point is located where a first etching process, which takes place on the first surface of the substrate, and a second etching process, which takes place on the second surface of the substrate, meet.

6. The vibration unit according to claim 5,
wherein the meeting position is located at the end of the beam in a width direction of the beam.

7. The vibration unit according to claim 6,
wherein the vibration element is an optical unit that includes a reflection unit configured to reflect light.

8. The vibration unit according to claim 1,
wherein the vibration element has a reflective coating including a titanium layer, a platinum layer, and a gold layer.

9. The vibration unit according to claim 8,
wherein the platinum layer has a thickness of 0.05 μm.

10. The vibration unit according to claim 8,
wherein the gold layer has a thickness of 0.05 μm.

11. The vibration unit according to claim 1,
wherein the vibration unit includes two pairs of ribs which are indentations formed in the substrate on an opposite side of a surface containing a reflective coating.

12. The vibration unit according to claim 1,
wherein the beam includes two etched surfaces.

13. The vibration unit according to claim 1,
wherein an upper-most portion of the frame is located higher than an upper-most position of the vibration element.

* * * * *